(12) United States Patent
Enström et al.

(10) Patent No.: US 6,188,016 B1
(45) Date of Patent: Feb. 13, 2001

(54) PROTECTION FOR ELECTROMAGNETIC CONNECTION AND ELECTROSTATICAL DISCHARGE

(75) Inventors: Kent Enström, Kungsängen; Hans-Olov Essland, Järfalla; Björn Kassman, Haninge; Anders Svensson, Skärholmen; Erik Torhage, Huddinge, all of (SE)

(73) Assignee: Telefonaktiebolaget LM Ericcsson (publ), Stockholm (SE)

( * ) Notice: Under 35 U.S.C. 154(b), the term of this patent shall be extended for 0 days.

(21) Appl. No.: 09/101,830

(22) PCT Filed: Jan. 17, 1997

(86) PCT No.: PCT/SE97/00071

§ 371 Date: Oct. 1, 1998

§ 102(e) Date: Oct. 1, 1998

(87) PCT Pub. No.: WO97/26783

PCT Pub. Date: Jul. 24, 1997

(30) Foreign Application Priority Data

Jan. 18, 1996 (SE) .................................................. 9600183

(51) Int. Cl.[7] ................................................ H05K 9/00
(52) U.S. Cl. ............... 174/35 R; 174/35 C; 174/35 MS; 361/827
(58) Field of Search ................................ 174/35 R, 35 C, 174/35 MS, 51; 361/816, 818, 827, 753

(56) References Cited

U.S. PATENT DOCUMENTS

| | | | |
|---|---|---|---|
| 4,547,623 | 10/1985 | Van Brunt et al. ................. | 174/35 R |
| 5,081,326 | * 1/1992 | Usui ........................................ | 174/47 |
| 5,091,604 | * 2/1992 | Kirma ..................................... | 174/2 |
| 5,329,066 | * 7/1994 | Hansson ................................ | 174/151 |
| 5,717,576 | * 2/1998 | Van Doeselaar et al. ............ | 361/816 |

FOREIGN PATENT DOCUMENTS

| | | |
|---|---|---|
| 0 219 639 | 4/1987 | (EP) . |
| 94/20968 | 9/1994 | (WO) . |

* cited by examiner

*Primary Examiner*—Kristine Kincaid
*Assistant Examiner*—W. David Walkenhorst
(74) *Attorney, Agent, or Firm*—Burns, Doane, Swecker & Mathis, L.L.P.

(57) ABSTRACT

An arrangement for electrically connecting two pieces of electronic equipment includes a tube-like element that connects a first cage with a second cage. The tube-like element is electrically connected to the two cages and with cables extending between the two cages. The inner diameter is adapted to the combined diameter of the cables.

14 Claims, 4 Drawing Sheets

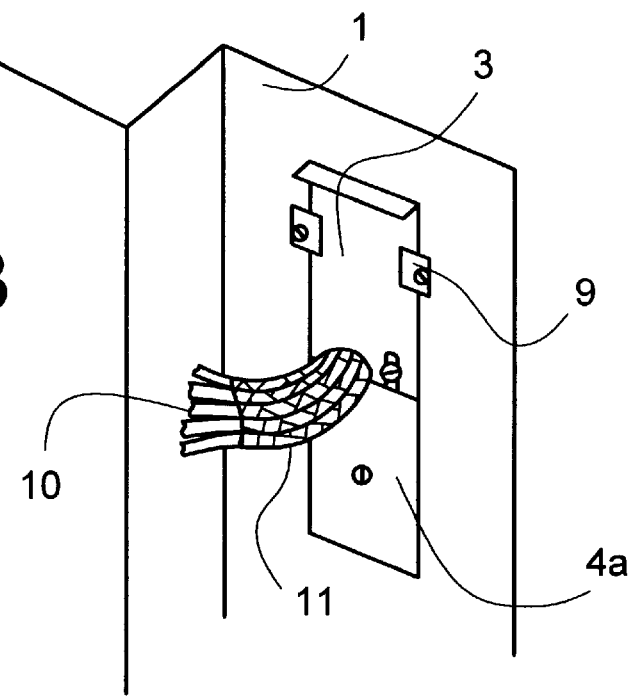
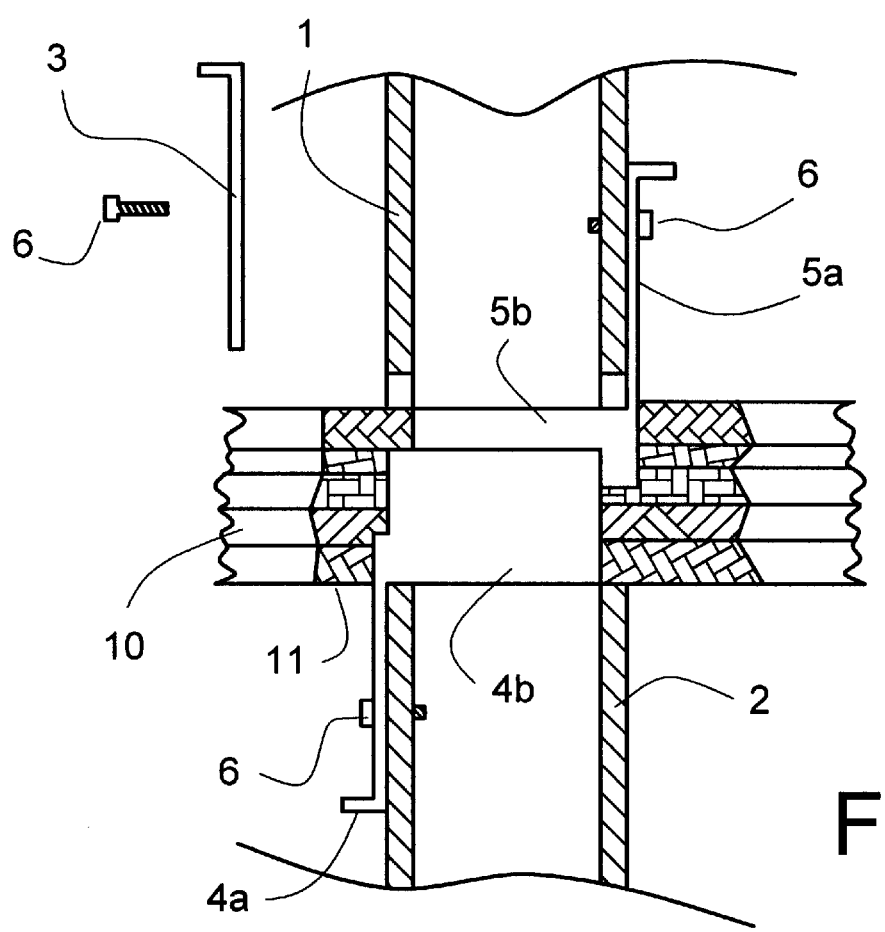

PROTECTION FOR ELECTROMAGNETIC CONNECTION AND ELECTROSTATICAL DISCHARGE

FIELD OF INVENTION

The present invention relates to an arrangement for mutually coupling electrically two pieces of electronic equipment, each having good EMC properties and retaining said properties.

DESCRIPTION OF THE BACKGROUND ART

It is known to enclose sensitive electronic equipment in an electrically conductive cage, a Faraday cage, to obtain good electromagnetic compatibility (EMC) with respect to said equipment, e.g. protection against electrostatic discharges (ESD).

In those situations when duplicate systems are used, two such pieces of equipment, will normally stand side-by-side so that the first piece of equipment is able to take over the functions of the second piece of equipment should this second piece of equipment malfunction or require inspection. It is, of course, possible to enclose both pieces of equipment in one and the same cage, thereby protecting both pieces of equipment. However, problems arise when the first piece of equipment needs to be repaired or serviced. In order to obtain access to this equipment, it is necessary to open the cage, which will impair the EMC properties with respect to the second piece of equipment, therewith risking disablement of the second piece of equipment and therewith a total breakdown. It is therefore necessary to enclose each piece of equipment in its respective cage.

In order for equipment that has good EMC properties in general to communicate with other equipment via cables for instance, it is necessary to provide holes in the cage that encloses the equipment and that constitutes the actual basis for said good EMC properties. Such holes enable radiation to leak into and out of the cage, resulting in poorer EMC properties.

When two cages stand side-by-side, electrical discharges, ESD, from one piece of equipment in the first cage are able to pass out through the hole therein and wander through the air or along electric conductors and in through the hole in the second cage and there disable the equipment enclosed by this second cage. This is, of course, highly unfortunate and presents a specific problem to the application of duplicated systems.

There are many different causes of electrostatic discharges, ESD. For instance, the equipment may be subjected to such discharge by a person coming into contact with the equipment or solely being present in the proximity thereof. In order to prevent such an occurrence, there are often provided special grounding or earthing points at which a person is able to connect up an electrically conductive arm band and therewith obtain the same ground, or earth, as the equipment, thereby preventing an ESD. Unfortunately, an ESD will sometimes occur before the person concerned has been able to ground his body at a grounding point, which may have catastrophic consequences in the case of sensitive equipment. A second person can cause an ESD, even though the first person is grounded or earthed. If the first person has had time to open the cage, the EMC properties of the equipment enclosed therein will be greatly impaired, and even if the actual discharge does not cause problems, the electromagnetic radiation caused by the discharge may play havoc and create problems with respect to nearby equipment, by passing through holes that carry electric cables.

Computers that are used for switching purposes in telephony are often duplicated, so that if the first computer is disabled, the other computer will take over. When repairing the first computer, it is extremely important that no electrostatic discharges caused by a careless technician will also disable the other computer, which would result in a total breakdown in operations. The problem is particularly serious in respect of new types of IC circuits that are extremely sensitive to static discharges.

SUMMARY OF THE INVENTION

The invention solves the aforesaid problem of enabling part of a duplicated system to be serviced without impairing EMC properties, e.g. without impairing ESD protection, of the other part of the system, by minimising the open hole area and sealingly enclosing the shield of the connection cables with a grounded electric conductor, and electrically connecting said conductor to the cages.

More specifically, the solution is achieved with the aid of a tube-like element which connects the two cages. The inner diameter of the tube-like element is adapted to the diameter of the cables received in the hole so as to obtain a sealed joint. The holes provided in the sides of the cages are sufficiently large to accommodate an electric contact element of reasonable size, meaning that the holes may be substantially larger than the thickness of the cables received therein. These holes are covered with an electrically conductive member, for instance a steel plate, such as to adapt the hole opening to the diameter of the cables.

The object of the invention is to prevent an electrostatic discharge occurring in one cage or the equipment encased thereby from wandering through the air or through electric conductors to the other cage or the equipment encased thereby, so that the EMC properties of one part of a duplicated system will be retained even when the protection in the other part is partially non-existent, so as to be able to pass cables effectively from one piece of equipment to another while retaining EMC properties, e.g. ESD protection, and to be able to carry out repairs and servicing on one side of a duplicated system without impairing the EMC properties of the other side.

The advantages thus afforded are good EMC properties between the two parts of a duplicated system, minimisation of the risk of disabling both sides of duplicated equipment as a result of an electrostatic discharge. Other advantages are that the solution is simple and inexpensive, that the solution enables cables having large electric contact devices in relation to cable thickness to be passed from one piece of equipment to other pieces of equipment, that ESD spikes will not wander from one piece of equipment to the other, and that the one cage will still provide good EMC properties and be protected against radiation caused by ESD, for instance, even when the other cage is open and has lost its ESD protection.

BRIEF DESCRIPTION OF THE DRAWINGS

The invention will now be described in more detail with reference to exemplifying embodiments thereof and also with reference to the accompanying drawings, in which

FIG. 3 is a perspective view of one part of one embodiment;

FIGS. 4–6 illustrate alternative embodiments schematically and in cross-section.

DETAILED DESCRIPTION OF PREFERRED EMBODIMENTS

Figure 1:
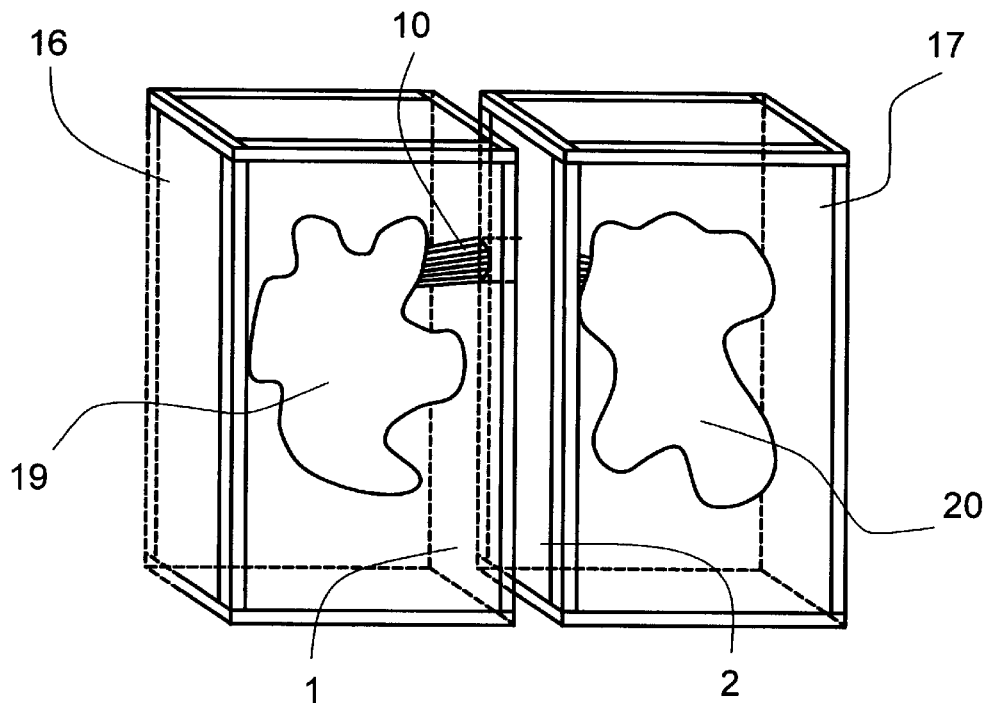
FIG. 1 illustrates two cages in perspective.

FIG. 1 illustrates schematically first electronic equipment 19 enclosed in a first cage 16, second electronic equipment 20 enclosed in a second cage 17, and cables 10 which function to connect the two pieces of equipment 19, 20 electrically. The sides of the cages are comprised of an electrically conductive material and may include small holes for ventilation purposes, for instance. The diameter of the holes determine how much electromagnetic radiation is able to leak from the cage and consequently the requirements set by the authorities or determined by the sensitivity of peripheral equipment to radiation will determine the size of the holes.

Figure 2:
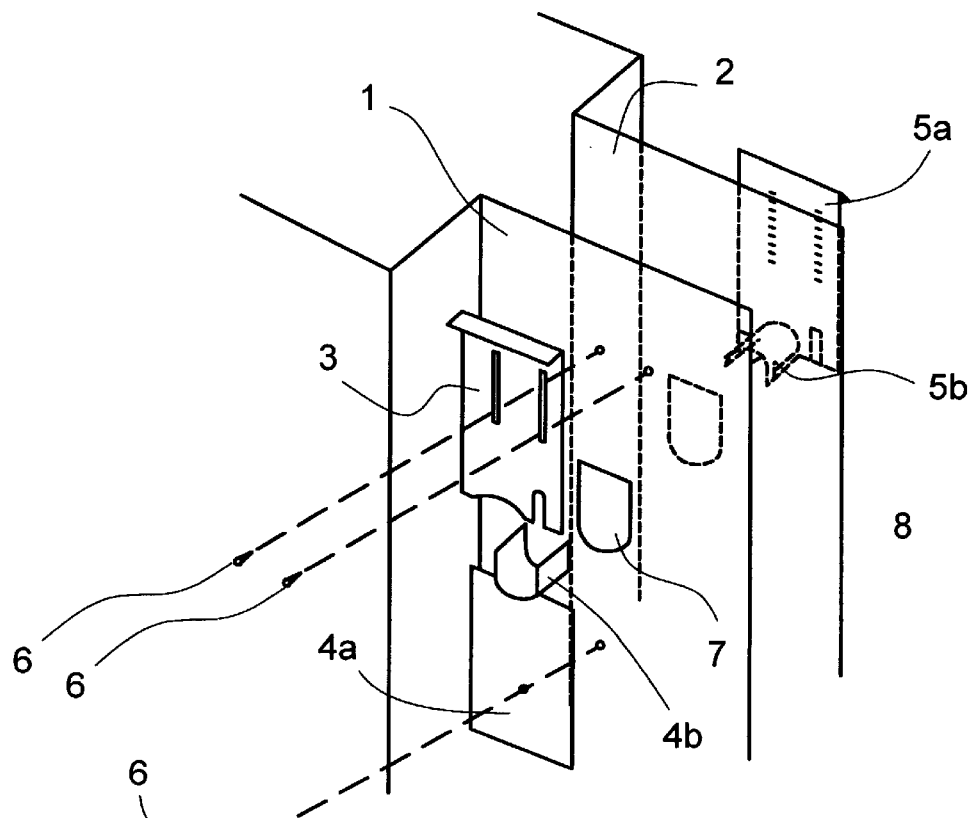
FIG. 2 is a perspective view of one embodiment.
Figure 5:
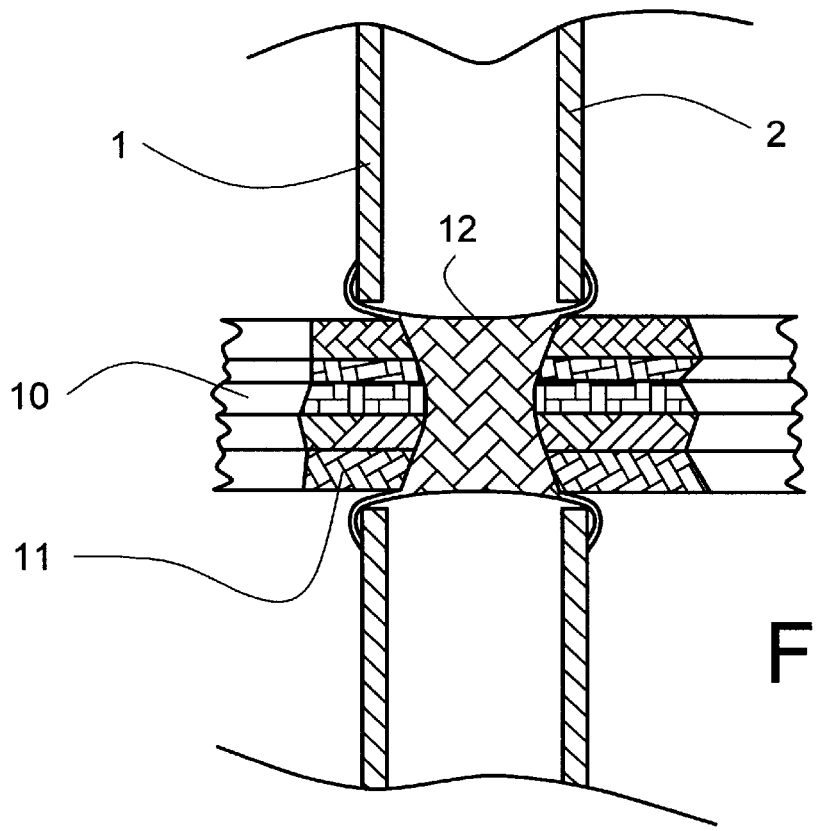

FIG. 2 is a perspective view of one embodiment of an inventive arrangement. Reference numeral 1 identifies one side of the first cage and reference numeral 2 identities one side of the second cage. Reference 5a identifies a first plate having a first U-shaped bar 5b located on its lower edge. Reference 4a identifies a second plate which has a second U-shaped bar 4b located on its upper edge. Reference 3 identifies a third plate. Reference 6 identifies screws and reference 7 identifies a first hole in the first cage, and reference 8 identifies a second hole in the second cage. FIG. 3 illustrates the cables 10 and the cable shields 11. FIG. 5 illustrates an electrically conductive stocking 12.

Figure 6:
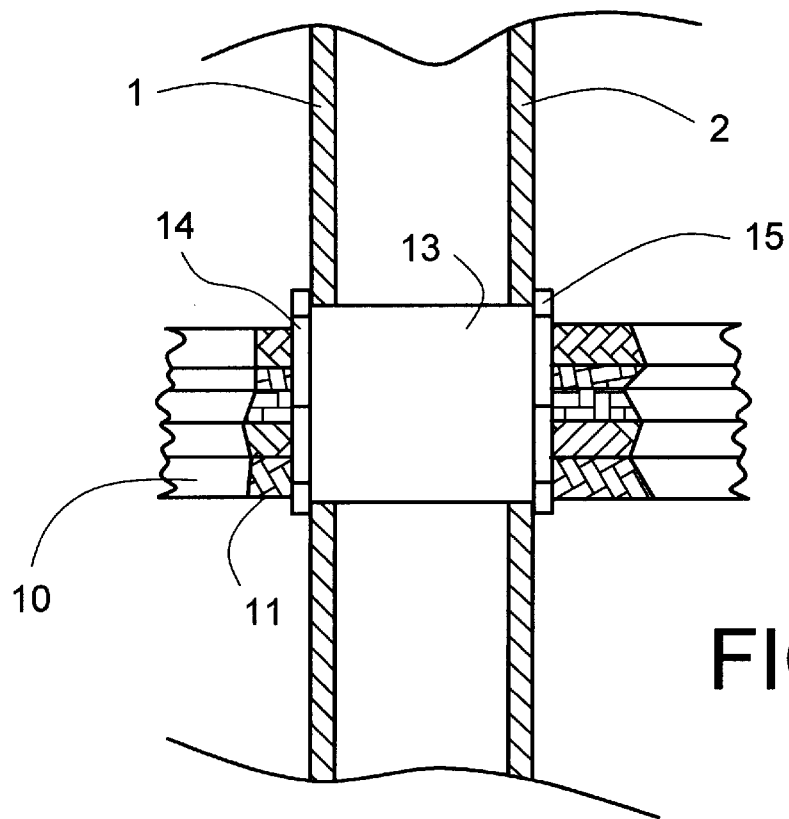
Figure 8:
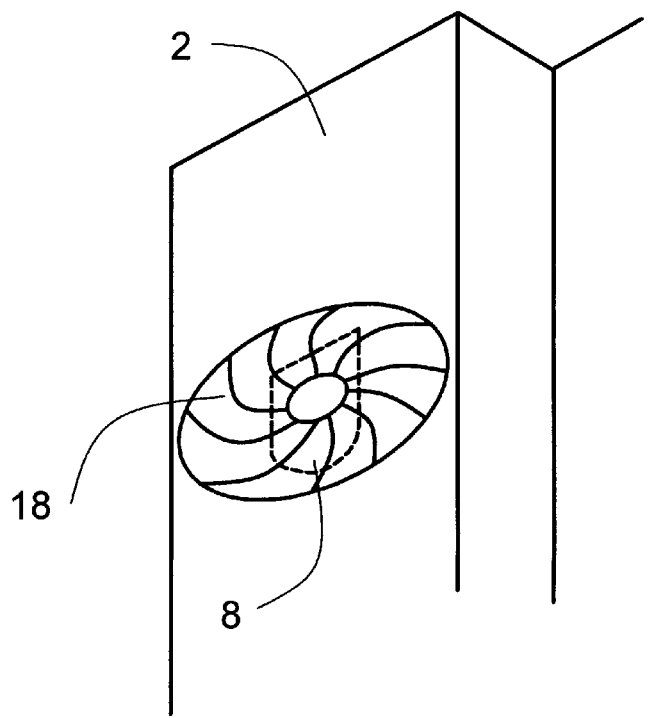

FIG. 6 illustrates an electrically conductive tube 13 and two nuts 14 and 15. FIG. 8 illustrates shutter means 18. Mutually corresponding elements in the various Figures have been identified with the same reference signs.

The second plate 4a is attached to the bottom edge of the second U-shaped bar 4b flush with the short side, as shown in FIG. 2. The second U-bar 4b is inserted into the first hole 7, such that the second plate 4a will lie in abutment with the cage side beneath the first hole 7. The length of the second U-bar 4b is adapted to the distance between the cages, so that the opposite short side of the U-bar will lie in abutment with the side 2 of the second cage. The size of the holes 7, 8 may be adapted to the cable contact devices, which can be substantially larger than the cables 10 themselves, so as to enable cables and contact devices to be drawn readily between the two cages 16, 17.

The first U-bar 5b is attached to the first plate 5a in the same way as that in which the second plate 4a and the second bar 4b are attached to each another. The first U-bar 5b is inserted into the second hole 8, such that the first plate 5a will be in abutment with the side 2 of the second cage over the second hole 8, and such that the opposing short side of the U-bar will be in abutment with side 1 of the first cage. The first bar 5b will therewith face downwardly. The first bar 5b is slightly smaller than the second bar 4b therewith enabling it to fit into the second bar 4b. Because the plate 5a is slotted, the first plate 5a can be attached to the cage side so that the first bar 5b will press against the cables with the plate covering the upper part of the second hole 8 at the same time. When the first plate 5a is in an upwardly displaced position, cables fitted with contact devices can be led from the first cage 16 to the second cage 17. The cables 10 are peeled so as to expose the cable shields 11 between the first and second cages 16 and 17.

Subsequent to having drawn the cables between the cages, the first plate 5a is pressed downwards so as to obtain good contact between the cable shields 11, the second U-bar 4b and the first U-bar 5b. This will result in the formation of a tight tube between the first and second cages 16 and 17 and also in electrical contact between the formed tube, the cable shields, and the first and the second cages.

The plate 3 is fastened in the first side 1 and moved down so as to seal the first hole 7. The second plate 5a functions to seal the second hole 8 on the second side 2 of the second cage in a similar manner.

FIG. 3 shows the second plate 4a and the third plate 3 in position with the cables drawn through the hole. A different method of fastening the plate 3 has been used in this case. In this embodiment, the plate 3 moves behind two smaller plates 9 which are removably attached to the first cage side 1. Subsequent to having moved the plate 3 down to its active position, the plates 9 are secured more firmly with the aid of spring elements for instance, or with the aid of screws as in the illustrated case.

FIG. 4 illustrates this embodiment in cross-section prior to the third plate 3 being secured but subsequent to having moved down the first plate 5a.

FIG. 5 shows an alternative embodiment in which there is used an electrically conductive stocking 12 of the kind typically used to shield cables. The stocking is attached to side 1 of the first cage with the aid of an annulus, which is secured with screws. The stocking is thereafter kept loose and the cables and contact devices drawn through the stocking. Subsequent to having drawn all cables through the stocking, the stocking is tightened to reduce its diameter and thereby sealingly embrace the cables, and is then secured to side 2 of the second cage.

FIG. 6 illustrates a solution that utilizes a tube 13 which is secured with the aid of nuts 14, 15. In this case, the internal diameter of the tube itself need not be adapted to the actual diameter taken-up by the cables 10. On the other hand, the active diameter can be adapted by filling the cavity defined between the cable shields 11 and the inner wall surface of the tube with an electrically conductive material, for instance steel wool or buckled or crunched aluminium foil.

Figure 7:
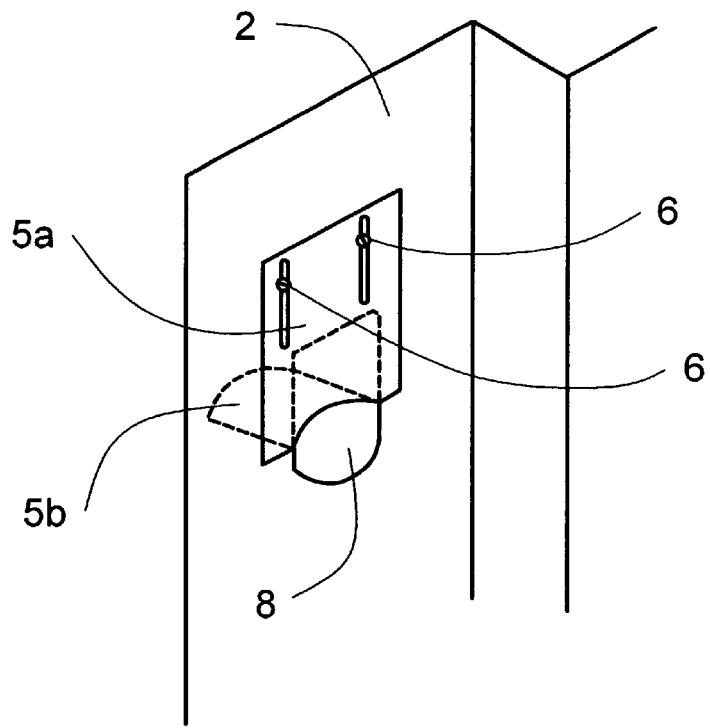
FIGS. 7–8 illustrate schematically parts of different embodiments.

FIG. 7 shows the first plate 5a attached to the second side 2 of the second cage.

FIG. 8 illustrates a shutter means 18 that can be used as an alternative to the plate for adapting the hole opening to the diameter presented by the cables.

What is claimed is:

1. An arrangement for electrically connecting with the aid of shielded cables (10), a first piece of equipment (19) that has good electromagnetic compatibility properties (EMC), by virtue of being enclosed in a first electrically grounded cage (16), to a second piece of equipment (20) having good EMC properties, by virtue of being enclosed in a second electrically grounded cage (17), by drawing the cables through holes (7, 8) in the two cages (16, 17) without impairing the EMC properties of said two pieces of equipment, wherein the first cage (16) is connected to the second cage (17) through the medium of a tube-like element (4b, 5b; 12; 13); the tube-like element (4b, 5b; 12; 13) is disposed in the proximity of the holes (7, 8) and comprises two elongated U-shaped bars(4b, 5b), the first U-shaped bar (5b) having a first plate (5a) attached to and extending away from the rounded part of the bar with the normal parallel with the axis of said U-shaped bar, the first plate being fastened to a side (2) of the second cage, and a second U-shaped bar (4b) fastened to a side (1) of the first cage, the first plate (5a) is displaceable in a direction perpendicular to the axis of the U-shaped bar thereby pushing the first U-shaped bar (5b) into the second U-shaped bar (4b) and forming a tube of adjustable internal diameter; the active internal diameter of the tube-like element (4b, 5b; 12; 13) is adjusted to equal to the combined diameter of the cables (10); the tube-like element (4b, 5b; 12; 13) is in electrical contact with the shielding (11) on respective cables (10); the active area of the holes (7, 8) in said cages is larger than the diameter taken-up by the cables (10) that are passed therethrough; the tube-like element (4b, 5b; 12; 13) is in electrical contact with the two cages (16, 17); and the open area of the hole (7) in the first cage is further shielded with a radially displaceable plate (3), the plate having a semicircular recess in the bottom of said plate.

2. An arrangement according to claim 1, wherein the cages (16, 17) are constructed as cabinets in which the equipment (19, 20) are arranged.

3. An arrangement for controlling switched telephone traffic comprising at least two cages (16, 17) that enclose electronic equipment (19, 20) having good EMC properties, wherein the equipment in said cabinet are mutually connected electrically by cables (10) through the medium of an arrangement according to claim 1.

4. An arrangement for electrically connecting and electromagnetically shielding a first and second piece of equipment connected via cables, the arrangement comprising:

a first electrically conductive cage;

a second electrically conductive cage;

a first hole disposed in the first cage;

a second hole disposed in the second cage;

a first plate having a first U-shaped member received within one of the first and second holes;

a second plate having a second U-shaped member received within the other of the first and second holes; and the first and second plates being relatively movable, and the first and second U-shaped members configured to cooperate with each other to form a tube of an adjustable internal diameter adapted to receive the cables.

5. The arrangement of claim 4, wherein the first and second cages are electrically grounded.

6. The arrangement of claim 4, wherein the first and second piece of equipment comprise telephone switching computers.

7. The arrangement of claim 4, wherein the first U-shaped member is attached to a lower edge of the first plate and the second U-shaped member is attached to an upper edge of the second plate.

8. The arrangement of claim 4, wherein the second plate is flush with a side of one of the first and second cages, and the second U-shaped member has a length that spans the distance of separation between the first and second cages and abuts a side of the other of the first and second cages.

9. The arrangement of claim 8, wherein the first plate is flush with a side of the other of the first and second cages, and the first U-shaped member is received within the hole of the other cage.

10. The arrangement of claim 9, wherein the first U-shaped member is smaller than and capable of being received within the second U-shaped member.

11. The arrangement of claim 10, wherein the electrical contact is established between the first U-shaped member, second U-shaped member, shielding material of the cables, first cage, and second cage.

12. The arrangement of claim 4, further comprising a third plate flush with a side of the same cage as the second plate is flush with.

13. The arrangement of claim 12, wherein the first plate and the third plate are slotted.

14. The arrangement of claim 12, wherein the third plate is mounted to the side of the cage via a plurality of smaller plates.

* * * * *